(12) United States Patent
van Quach et al.

(10) Patent No.: US 7,609,125 B2
(45) Date of Patent: Oct. 27, 2009

(54) SYSTEM, DEVICE AND METHOD FOR REDUCING CROSS-TALK IN DIFFERENTIAL SIGNAL CONDUCTOR PAIRS

(75) Inventors: Minh van Quach, Fort Collins, CO (US); Nurwati S. Devnani, Fort Collins, CO (US); Robert B. Manley, Fort Collins, CO (US)

(73) Assignee: Avago Technologies Enterprise IP (Singapore) Pte. Ltd., Singapore (SG)

( * ) Notice: Subject to any disclaimer, the term of this patent is extended or adjusted under 35 U.S.C. 154(b) by 157 days.

(21) Appl. No.: 11/580,444

(22) Filed: Oct. 13, 2006

(65) Prior Publication Data

US 2008/0088007 A1   Apr. 17, 2008

(51) Int. Cl.
*H01P 3/08* (2006.01)
(52) U.S. Cl. ............................. 333/5; 333/238; 333/34
(58) Field of Classification Search ................... 333/1, 333/4, 5, 238, 34
See application file for complete search history.

(56) References Cited

U.S. PATENT DOCUMENTS

| | | | |
|---|---|---|---|
| 4,513,266 A * | 4/1985 | Ishihara ..................... 333/238 |
| 5,027,088 A | 6/1991 | Shimizu et al. |
| 5,418,504 A | 5/1995 | Nottenburg |
| 5,585,664 A | 12/1996 | Ito |
| 5,677,515 A | 10/1997 | Sel et al. |
| 5,828,555 A | 10/1998 | Itoh |
| 6,040,524 A * | 3/2000 | Kobayashi et al. ............ 174/36 |
| 6,166,440 A | 12/2000 | Yang |
| 6,265,672 B1 | 7/2001 | Eum et al. |
| 6,304,700 B1 | 10/2001 | Brand et al. |
| 6,352,914 B2 | 3/2002 | Ball et al. |
| 6,444,922 B1 | 9/2002 | Kwong |
| 6,559,484 B1 | 5/2003 | Lee et al. |
| 6,590,466 B2 | 7/2003 | Lin et al. |
| 6,677,831 B1 * | 1/2004 | Cheng et al. ................... 333/34 |
| 6,767,252 B2 | 7/2004 | McGrath et al. |
| 6,867,668 B1 * | 3/2005 | Dagostino et al. ........... 333/246 |
| 6,951,806 B1 | 10/2005 | Schweikert et al. |
| 7,002,253 B2 | 2/2006 | Katsura et al. |
| 7,030,455 B2 | 4/2006 | Gamand et al. |
| 7,043,706 B2 | 5/2006 | Brist et al. |

* cited by examiner

*Primary Examiner*—Benny Lee (57) ABSTRACT

Systems, devices and methods are disclosed herein for reducing crosstalk between pairs of differential signal conductors. One or more ground traces connected to one or more over- or under-lying ground planes by vias are located between pairs of differential signal conductors. The electrical shielding provided by the combination of the one or more ground traces and the one or more ground planes results in reduced crosstalk between different pairs of differential signal conductors, and facilitates high-speed data rates between integrated circuits and printed circuit boards. In a preferred embodiment, such ground traces and ground planes are employed in HiTCE packaging containing multiple pairs of differential signal conductors.

28 Claims, 8 Drawing Sheets

SYSTEM, DEVICE AND METHOD FOR REDUCING CROSS-TALK IN DIFFERENTIAL SIGNAL CONDUCTOR PAIRS

FIELD OF THE INVENTION

The present invention relates to the field of packaging for differential signal conductor pairs.

BACKGROUND

Crosstalk between differential pairs of conductors disposed in packaging for routing signals between a printed circuit board and a semiconductor device or chip can be a serious problem. When of sufficient magnitude, crosstalk can inhibit or even prevent the accurate transmission of signals to and from an integrated circuit device, especially in high-speed data communication applications such as high-speed routers and the like. As devices become smaller, and signal conductor pairs become more closely spaced, the problems caused by crosstalk increase.

One prior art solution for tackling the various problems presented by crosstalk is to increase the spacing between differential conductor pairs. Such a solution, however, requires additional package layers and cost.

Another prior art solution for dealing with crosstalk is to employ impedance excursions with varying spacing between differential conductor pairs while routing between an integrated circuit bump pitch to a printed circuit board ball pitch. This solution requires advanced non-linear design capabilities and is expensive and time-consuming to design properly.

Still another prior art solution for minimizing the impact of crosstalk is to increase the number of guard traces in a package. This approach, however, requires additional space, added guard traces, or a reduced number of signals that a given package layer can support. Adding package layers increases cost.

Adding to the complexities of designing packages with reduced crosstalk is the fact that parasitic capacitance effects introduced by solder bump and solder ball interconnects on such packages are notoriously difficult to model.

What is needed is a means of providing reduced crosstalk while increasing signal routing density, with crosstalk preferably being less than 1% (or −40 dB) in respect of data signals transmitted over signal conductor pairs. What is also needed is a means of providing optimum spacing between differential conductor pairs that results in constant impedance while routing between the varying pitch requirements of an integrated circuit and a printed circuit board.

Various patents containing subject matter relating directly or indirectly to the field of the present invention include, but are not limited to, the following:

U.S. Pat. No. 7,043,706 to Brist et al. for "Conductor trace design to reduce common mode cross-talk and timing skew," May 9, 2006.

U.S. Pat. No. 6,304,700 to Brand et al. for "Device for transmitting high-frequency communication signals and method for manufacturing the device," Oct. 16, 2001.

U.S. Pat. No. 5,418,504 to Nottenburg for "Transmission line," May 23, 1995.

U.S. Pat. No. 6,951,806 to Schweikert et al. for "Metal region for reduction of capacitive coupling between signal lines," Oct. 4, 2005.

U.S. Pat. No. 6,166,440 to Yang for "Interconnection for preventing signal interference in a semiconductor device," Dec. 26, 2000.

U.S. Pat. No. 7,002,253 to Katsura et al. for "Semiconductor device and design method thereof," Feb. 21, 2006.

U.S. Pat. No. 6,352,914 to Ball et al. for "Interleaved signal trace routing," Mar. 5, 2002.

U.S. Pat. No. 6,559,484 to Lee et al. for "Embedded enclosure for effective electromagnetic radiation reduction," May 6, 2003.

U.S. Pat. No. 6,265,672 to Eum et al. for "Multiple layer module structure for printed circuit board," Jul. 24, 2001.

U.S. Pat. No. 5,585,664 to Ito for "Semiconductor integrated circuit device," Dec. 17,1996.

U.S. Pat. No. 7,030,455 to Gamand et al. for "Integrated electromagnetic shielding device," Apr. 18, 2006.

U.S. Pat. No. 5,027,088 to Shimizu et al. for "Signal wiring board," Jun. 25, 1991.

U.S. Pat. No. 6,590,466 to Lin et al. for "Circuit board having shielding planes with varied void opening patterns for controlling the impedance and the transmission time of differential transmission lines," Jul. 8, 2003.

U.S. Pat. No. 6,767,252 to McGrath et al. for "High speed differential signal edge card connector and circuit board layouts therefor," Jul. 27, 2004.

U.S. Pat. No. 6,444,922 to Kwong for "Zero cross-talk signal line design," Sep. 3, 2002.

U.S. Pat. No. 5,828,555 to Itoh for "Multilayer printed circuit board and high-frequency circuit device using the same," Oct. 27, 1998.

U.S. Pat. No. 5,677,515 to Sel et al. for "Shielded multilayer printed wiring board, high frequency, high isolation," Oct. 14, 1997.

The dates of the foregoing publications may correspond to any one of priority dates, filing dates, publication dates and issue dates. Listing of the above patents and patent applications in this background section is not, and shall not be construed as, an admission by the applicants or their counsel that one or more publications from the above list constitutes prior art in respect of the applicant's various inventions. All printed publications and patents referenced herein are hereby incorporated by referenced herein, each in its respective entirety.

Upon having read and understood the Summary, Detailed Descriptions and Claims set forth below, those skilled in the art will appreciate that at least some of the systems, devices, components and methods disclosed in the printed publications listed herein may be modified advantageously in accordance with the teachings of the various embodiments of the present invention.

SUMMARY OF THE INVENTION

Systems, devices and methods are disclosed herein for reducing crosstalk between pairs of differential signal conductors. One or more ground traces connected to one or more over- or under-lying ground planes by vias are located between pairs of differential signal conductors. The electrical shielding provided by the combination of the one or more ground traces and the one or more ground planes results in reduced cross-talk between different pairs of differential signal conductors, and facilitates high-speed data rates between integrated circuits and printed circuit boards. In one preferred embodiment of the present invention, such ground traces and ground planes are employed in HiTCE packaging containing multiple pairs of differential signal conductors.

In one embodiment of the present invention, there is provided a device for reducing cross-talk in a differential signal conductor pair, comprising a substrate, a first ground plane disposed on or in the substrate, a pair of first and second differential signal conductors disposed within the substrate and substantially in a first plane, and a first ground trace disposed in the substrate between the first and second conductors and substantially in the first plane, the first ground trace being electrically connected to the first ground plane. The first ground plane may be disposed on or in the substrate in a second plane located above the pair of differential signal conductors. A second ground trace may also be disposed in the substrate on the side opposite the first conductor from the first ground trace, the second ground trace being disposed substantially in the first plane and electrically connected to the first ground plane. A third ground trace may be disposed in the substrate on the side opposite the second conductor from the first ground trace, the third ground trace being disposed substantially in the first plane and electrically connected to the first ground plane. The first conductor and the second conductor may have various trace widths and trace heights. The spacing between the first ground trace and the first conductor or the second conductor may also vary, depending on the particular design parameters and constraints at hand, as may the spacing between the first plane and a second plane, where the second ground plane is disposed on or in the substrate in a third plane located below the pair of differential signal conductors, one of the ground traces being electrically connected thereto. Although the conductors, ground traces, vias and ground planes of the above device are typically formed of copper, other suitable metals, metal alloys and electrically conductive materials may also be employed.

Some embodiments of the substrate of the present invention comprise ceramic, HiTCE ceramic, high-temperature ceramic, high-temperature ETC ceramic, resin, glass, an electrically insulative material, a dielectric material, a high dielectric material, a printed circuit board, an SLC, organic material or any other suitable material.

The various embodiments of the present invention are particularly well suited for use in high-speed communications applications such as high-speed routers and high-speed servers.

In another embodiment of the present invention, there are provided means for reducing cross-talk in a differential signal conductor pair, comprising a substrate, a first planar means of grounding disposed on or in the substrate, a pair of first and second differential signal conducting means disposed within the substrate and substantially in a first plane, and a first ground trace means disposed in the substrate between the first and second conducting means and substantially in the first plane, the first ground trace means being electrically connected to the first grounding means.

In yet another embodiment of the present invention, there is provided a method of making a device for reducing cross-talk in a differential signal conductor pair, comprising providing a substrate, providing a first ground plane disposed on or in the substrate, providing a pair of first and second differential signal conductors disposed within the substrate and substantially in a first plane, and providing a first ground trace disposed in the substrate between the first and second conductors and substantially in the first plane, the first ground trace being electrically connected to the first ground plane. Such a method may further comprise disposing the first ground plane on or in the substrate in a second plane located above the pair of differential signal conductors; disposing a second ground trace in the substrate on the side opposite the first conductor from the first ground trace, the second ground trace being located substantially in the first plane and electrically connected to the first ground plane; disposing a third ground trace in the substrate on the side opposite the second conductor from the first ground trace, the third ground trace being located substantially in the first plane and electrically connected to the first ground plane; providing a second ground plane disposed on or in the substrate in a third plane located below the pair of differential signal conductors, the first ground trace being electrically connected thereto; providing a substrate comprising at least one of ceramic, HiTCE ceramic, high-temperature ceramic, high-temperature ETC ceramic, resin, glass, an electrically insulative material, a dielectric material, and a high dielectric material; incorporating the device into a HiTCE package; and/or configuring the device for use in high-speed communications equipment.

In yet other methods of the present invention, there are provided methods of using the above devices, or of using devices produced according to any one or more of the foregoing steps.

The various systems, devices and methods of the present invention may be optimized for the impedance of a given differential signal conductor pair, where such impedance ranges between about 50 ohms and about 150 ohms.

The various embodiments of the present invention provide one or more of reduced crosstalk between differential signal conductor pairs, higher density routing in a package of given size, and optimum spacing between differential signal conductor pairs resulting in constant impedance while routing between the varying pitch requirements of an integrated circuit and a printed circuit board. Alternatively, various embodiments of the present invention may be employed in a printed circuit board or inside an integrated circuit.

In addition to the foregoing embodiments of the present invention, review of the detailed description and accompanying drawings will show that other embodiments of the present invention exist. Accordingly, many combinations, permutations, variations and modifications of the foregoing embodiments of the present invention not set forth explicitly herein will nevertheless fall within the scope of the present invention.

BRIEF DESCRIPTION OF THE DRAWINGS

Different aspects of the various embodiments of the present invention will become apparent from the following specification, drawings and claims in which:

DETAILED DESCRIPTION OF SOME PREFERRED EMBODIMENTS OF THE INVENTION

Set forth below are detailed descriptions of some preferred embodiments of the systems, devices and methods of the present invention.

Figure 1:
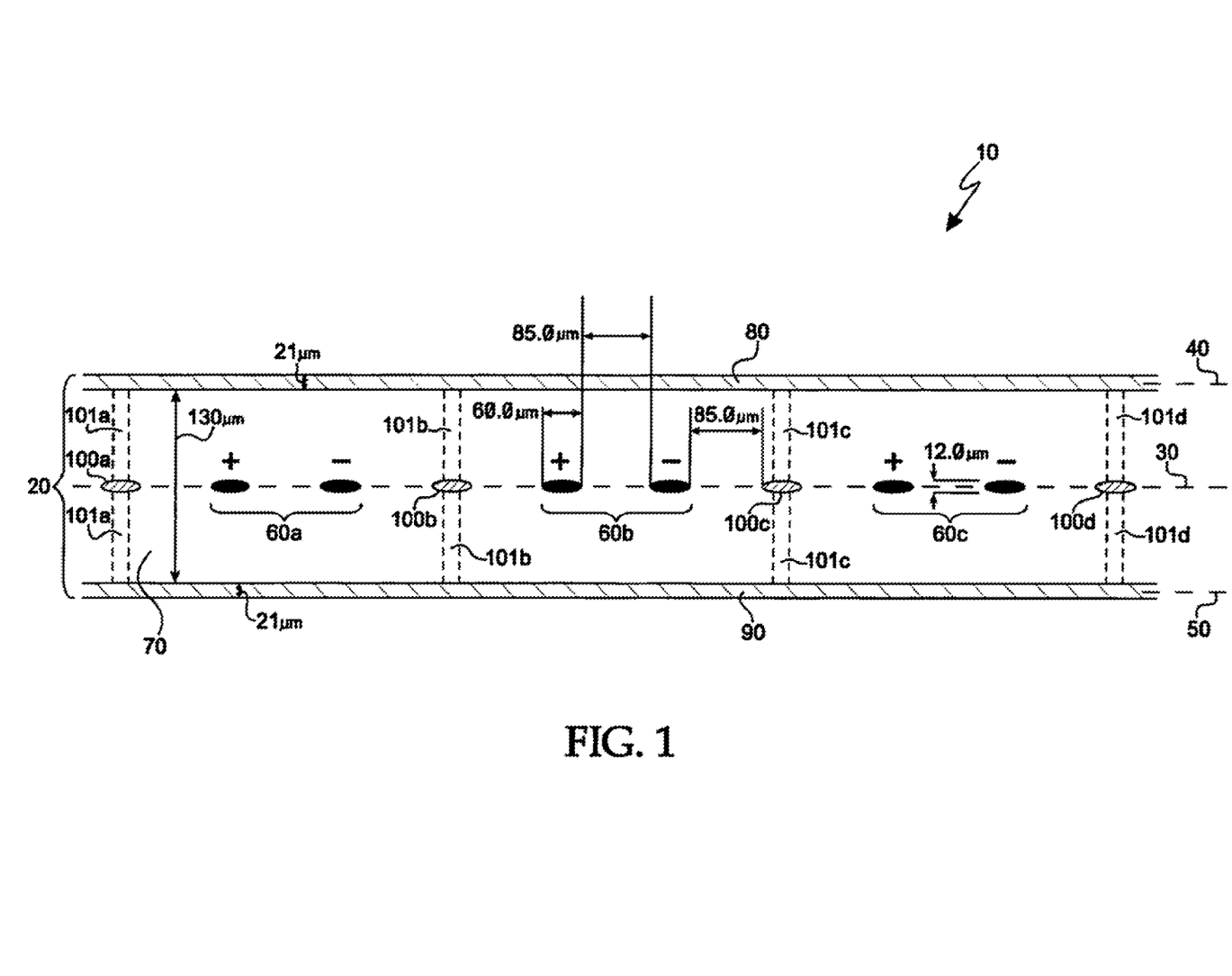
FIG. 1 shows a cross-sectional view of one embodiment of device 10 of the present invention for reducing cross-talk in differential signal conductor pairs.

FIG. 1 shows a cross-sectional view of one embodiment of device 10 of the present invention for reducing cross-talk in differential signal conductor pairs 60a, 60b and 60c. Each of conductor pairs 60a, 60b and 60c comprises one positive conductor ("+") and one negative conductor ("−"). Conductor pairs 60a, 60b and 60c are preferably located substantially within first plane 30, and are disposed within a matrix of appropriate material 70 forming substrate 20.

Figure 2:
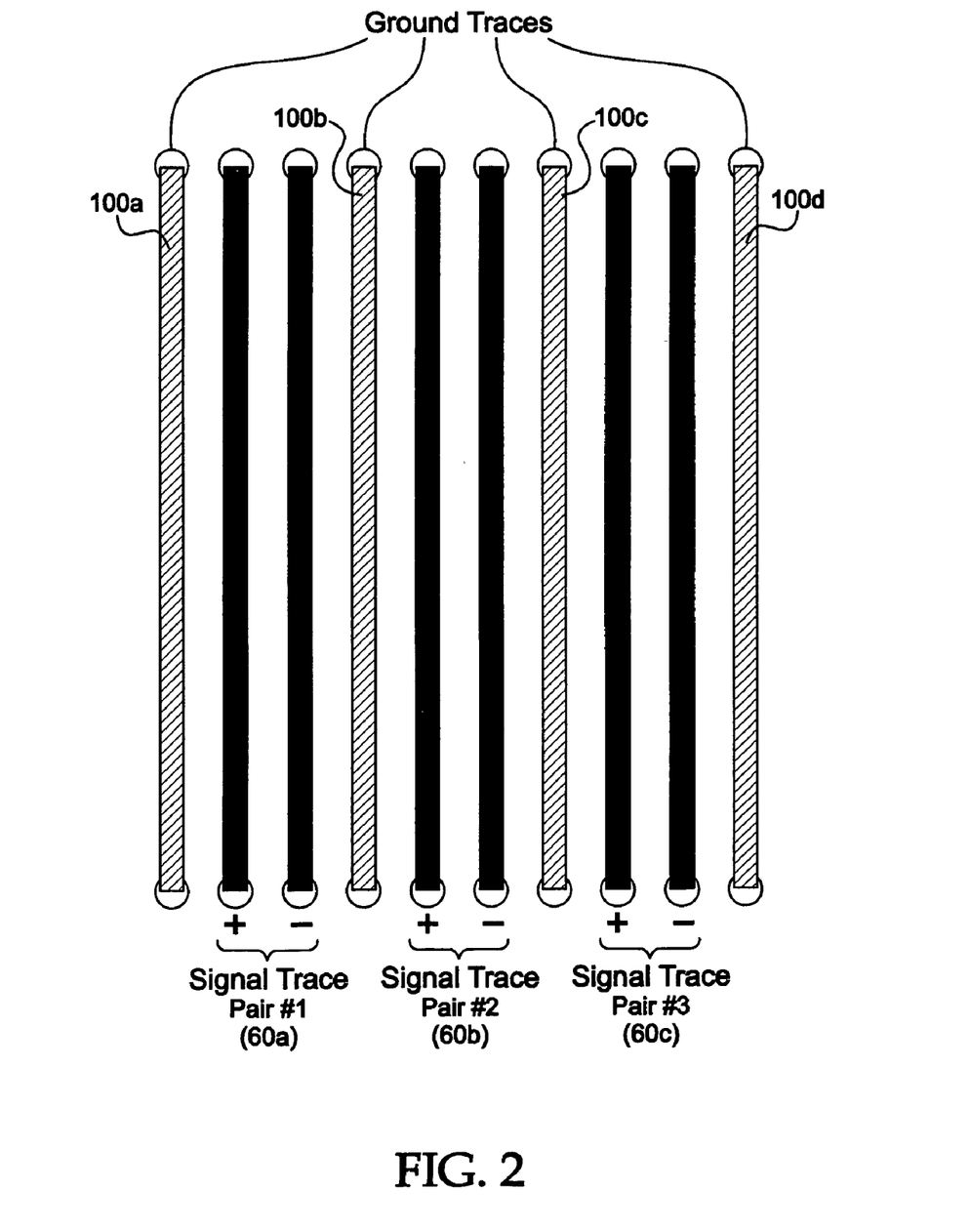
FIG. 2 shows a top plan view of the conductors and ground traces illustrated in FIG. 1.

FIG. 2 shows a top plan view of conductors 60a, 60b and 60c and ground traces 100a, 100b and 100c illustrated in FIG. 1. Note that in FIG. 2, material 70 illustrated in FIG. 1 is stripped away from above conductors 60a, 60b and 60c and ground traces 100a, 100b and 100c to permit better visual representation of conductors 60a, 60b and 60c and ground traces 100a, 100b and 100c. In practice, such material 70 would be present above conductor pairs 60a, 60b and 60c and ground traces 100a, 100b and 100c. Note further that Pair #1 in FIG. 2 corresponds to the two conductors labeled 60a in FIG. 1 with + and − signs disposed thereabove, that Pair #2 in FIG. 2 corresponds to the two conductors labeled 60b in FIG. 1 with + and − signs disposed thereabove, and that Pair #3 in FIG. 2 corresponds to the two conductors labeled 60c in FIG. 1 with + and − signs disposed thereabove.

Referring now to FIG. 1, it will be seen that ground traces 100a, 100b, 100c and 100d are disposed in substrate 20 between differential signal conductor pairs 60a, 60b and 60c. Ground traces 100a, 100b, 100c and 100d are further located substantially within first plane 30 along with conductor pairs 60a, 60b and 60c, and are also disposed within the matrix of material 70 forming substrate 20.

Although not shown as such in FIG. 1, ground traces 100a, 100b, and 100c 100d are electrically connected to either or both of first ground plane 80 and second ground plane 90 through vias formed in matrix 70 and disposed between such ground traces and such ground planes. As shown in FIG. 1, ground plane 80 is disposed substantially in second plane 40, while ground plane 90 is disposed substantially in third plane 50.

In a "strip-line" embodiment of the present invention, first and second ground planes 80 and 90 sandwich package 10, and conductor pairs 60a-60c and ground traces 100a-100d are located substantially within first plane 30.

In a "micro-strip" embodiment of the present invention, only one ground plane 80 or 90 is positioned atop or underneath package 10, and features conductor pairs 60a-60c and ground traces 100a-100d located substantially within first plane 30.

Other embodiments of the present invention are contemplated as well, such as embodiments having no ground planes incorporated into package 10, but having ground traces disposed between pairs of differential signal conductors, and embodiments having more than two ground planes incorporated into package 10.

In preferred embodiments of the present invention, first and/or second ground planes 80 and 90 are electrically connected to ground traces 100a, 100b, 100c and 100d by copper vias spaced at 0.67 mm intervals along each trace length. Other configurations and spacings are also contemplated, such as vias that electrically interconnect one or more ground planes to one or more ground traces along about every 0.35 mm of ground trace length, along about every 0.5 mm of ground trace length, along about every 0.84 mm of ground trace length, along about every 1 mm of ground trace length, along about every 3 mm of trace length, along about every 4 mm of ground trace length, along about every 5 mm of ground trace length, along about every 6 mm of trace length, along about every 8 mm of ground trace length and along about every 10 mm of trace length. Still other configurations and spacings are also contemplated in the present invention, and depend on the particular package and design parameters that are to be employed.

Continuing to refer to FIG. 1, each conductor in conductor pairs 60a-60c preferably has a trace width of about 60 µm. Other trace widths are contemplated in the present invention, however, such as trace widths ranging between about 5 µm and about 200 µm, between about 20 µm and about 100 µm, between about 40 µm and about 80 µm, between about 50 µm and about 70 µm, and between about 55 µm and about 65 µm.

As shown in FIG. 1, each conductor in conductor pairs 60a-60c also preferably has a trace height of about 12 µm. Other trace heights are contemplated in the present invention, however, such as trace heights ranging between about 2 µm and about 100 µm, between about 4 µm and about 80 µm, between about 6 µm and about 40 µm, between about 8 µm and about 20 µm, or between about 10 µm and about 14 µm.

As shown in FIG. 1, spacing between conductors of differential signal conductor pairs 60a-60c and between conductors and ground traces is preferably about 85 µm. Other inter-conductor and conductor-ground trace spacings are contemplated in the present invention, however, such as spacings that range between about 10 µm and about 1000 µm, between about 20 µm and about 500 µm, between about 30 µm and about 250 µm, between about 40 µm and about 120 µm, and between about 60 µm and about 100 µm.

Note that constant spacing between differential signal conductor pairs 60a-60c and ground traces 100a-100d is generally preferred to maintain differential signal impedance stability. The width of ground traces 100a-100d along their respective routes may be varied to maintain uniform spacing between differential signal conductor pairs 60a-60c and ground traces 100a-100d as the conductors in differential signal conductor pairs 60a-60c diverge to accommodate pitch differences between, for example, integrated circuit bump pitches and printed circuit board ball pitches. Such variation in ground trace width also helps maintain constant impedance in differential signal conductor pairs 60a-60c. Note that constant inter-conductor spacing between the conductors of differential signal conductor pairs 60a-60c is generally preferred where changing pitches do not otherwise dictate.

Referring still to FIG. 1, spacing between first plane 80 and second plane 90 is preferably about 130 µm. Other spacings between ground planes are contemplated in the present invention, however, such as spacings ranging between about 20 µm and about 1000 µm, between about 40 µm and about 500 µm, between about 60 µm and about 400 µm, between about 80 µm and about 200 µm, and between about 100 µm and about 160 µm.

Ground planes 80 and 90 illustrated in FIG. 1 are nominally about 21 microns thick and are formed of copper. Other thicknesses for ground planes 80 and 90 are contemplated in the present invention, however, such as thicknesses ranging between about 30 µm and about 40 µm, between about 20 µm and about 60 µm, between about 10 µm and about 80 µm, between about 5 µm and about 100 µm, and between about 2 µm and about 200 µm.

It is important to note that the trace width, trace height, conductor width, conductor height, inter-conductor spacing, conductor-trace spacing, ground plane to trace spacing, ground plane to conductor spacing, and inter-ground-plane dimensions illustrated in FIG. 1 were determined on the assumption that each differential signal conductor pair had an impedance of 100 ohms. Those skilled in the art will understand that such dimensions depend on the particular impedance of each differential signal conductor pair, which in the present invention may range between about 50 ohms and about 150 ohms, and in preferred embodiments of the present invention range between about 75 ohms and about 125 ohms.

Material 70 of substrate 20 is preferably formed of high-temperature ceramic, and is preferably employed in a HiTCE ("High Temperature Coefficient of Expansion") package. Other materials may be employed in material 70 the present invention, including, but not limited to, ceramic, high-temperature ETC ceramic, resin, glass, electrically insulative materials, dielectric materials, high dielectric materials, and in certain cases combinations or mixtures of the foregoing. Substrate 20 need not form a HiTCE package or be formed of the foregoing materials. For example, substrate 20 may form a Surface Laminar Circuit ("SLC")™, a printed circuit board, have a surface suitable for wire bonding, or be formed from a suitable organic material.

Various embodiments of the present invention find particularly efficacious application in packages employed in high-speed communications equipment and circuitry, such as high-speed routers and servers.

Referring now to FIGS. 1 and 2, the individual traces of conductor pairs 60a, 60b and 60c may be formed of copper, aluminum, gold, silver, a metal, a metal alloy, or any other suitable electrically conductive material or metal, including alloys or combinations of the foregoing. Likewise, ground traces 100a, 100b and 100c, vias 101a, 101b and 101c and ground planes 80 and 90 may be formed of copper, aluminum, gold, silver, a metal, a metal alloy, or any other suitable electrically conductive material or metal, including alloys or combinations of the foregoing.

The nominal conductor, ground trace and ground plane spacings and dimensions illustrated in FIG. 1 result in a HiTCE package having less than −60 dB crosstalk between adjoining pairs of differential signal conductor pairs 60a-60c. Most packages designed and fabricated in accordance with the above teachings will have less than −40 dB of such crosstalk. The various embodiments of the present invention discussed hereinabove provide reduced crosstalk between differential signal conductor pairs, higher density routing in a package of given size, and optimum spacing between differential signal conductor pairs resulting in constant impedance while routing between the varying pitch requirements of an integrated circuit and a printed circuit board. Alternatively, various embodiments of the present invention may be employed in a printed circuit board or inside an integrated circuit.

Some embodiments of the present invention include methods of making and using devices for reducing cross-talk in a differential signal conductor pair. One such method includes, for example, providing a substrate, providing a first ground plane disposed on or in the substrate, providing a pair of first and second differential signal conductors disposed within the substrate and substantially in a first plane, and providing a first ground trace disposed in the substrate between the first and second conductors and substantially in the first plane, the first ground trace being electrically connected to the first ground plane.

Such a method may further comprise: (i) disposing the first ground plane on or in the substrate in a second plane located above the pair of differential signal conductors; (ii) disposing a second ground trace in the substrate on the side opposite the first conductor from the first ground trace, the second ground trace being located substantially in the first plane and electrically connected to the first ground plane; (iii) disposing a third ground trace in the substrate on the side opposite the second conductor from the first ground trace, the third ground trace being located substantially in the first plane and electrically connected to the first ground plane; (iv) providing a second ground plane disposed on or in the substrate in a third plane located below the pair of differential signal conductors, the first ground trace being electrically connected thereto; (v) providing at least one of ceramic, high-temperature ceramic, high-temperature ETC ceramic, resin, glass, an electrically insulative material, a dielectric material, and a high dielectric material for the substrate; (vi) incorporating the device into a HiTCE package; (vii) configuring the device for use in high-speed communications equipment such as a high-speed router or a high-speed server; (viii) increasing the spacing between the first and second conductors along at least portions of the first plane; and/or (ix) increasing the width of the first ground trace as the spacing between the first and second conductors increases.

Figure 8:
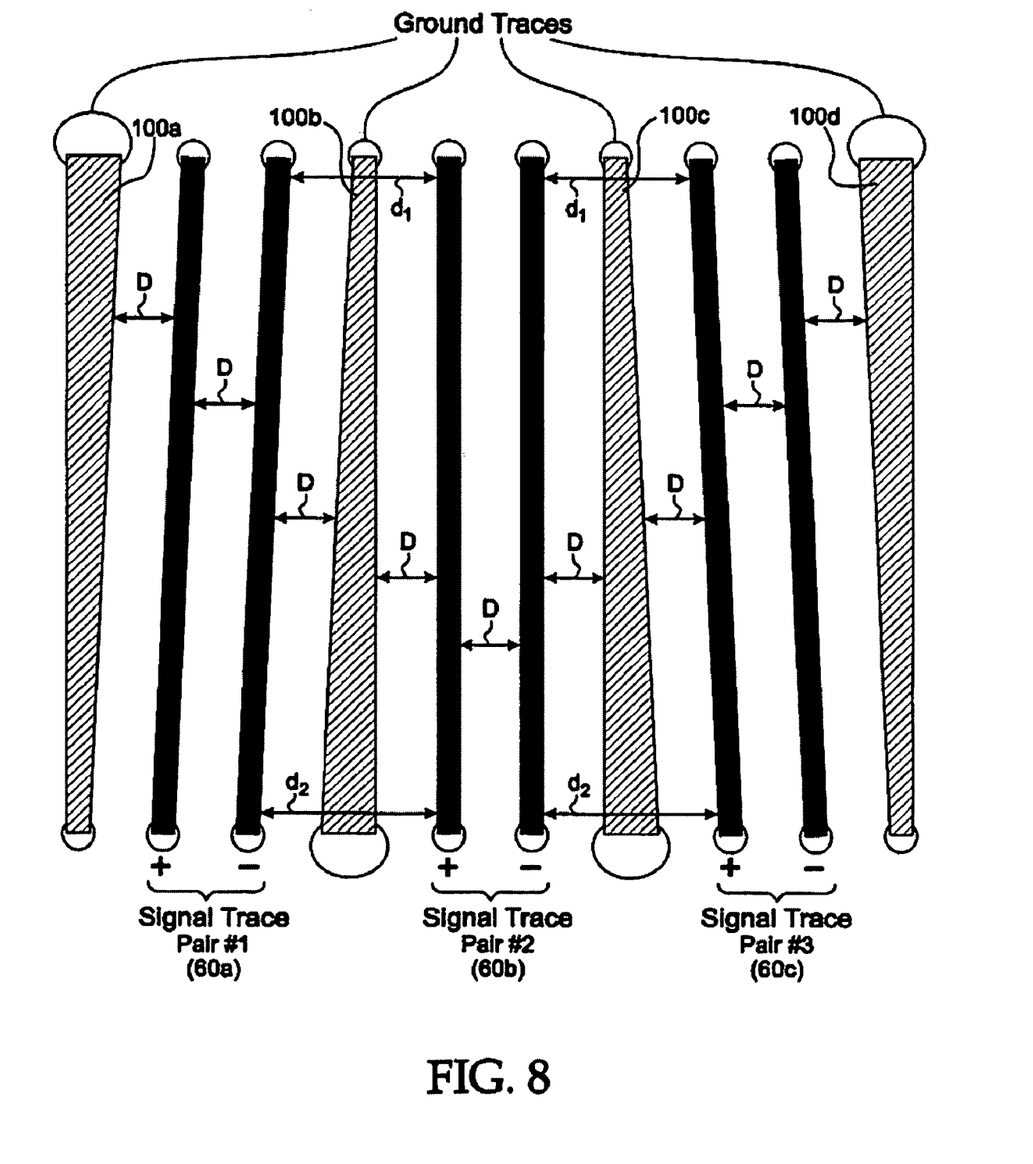
FIG. 8 shows a top plan view of another embodiment of conductors 60a-60c and ground traces 100a-100d.

Referring now to FIG. 8. there is shown a top plan view of another embodiment of signal trace pairs #1-#3 provided by respective conductors 60a-60c and corresponding ground traces 100a-100d. Note that in FIG. 8, material 70 (illustrated in FIG. 1) is stripped away from above conductors 60a-60c and around traces 100a-100d to permit better visual representation of conductors 60a-60c and ground traces 100a-100d. In practice, such material 70 would be present above conductor pairs 60a-60c and ground traces 100a-100d. As shown in FIG. 8, the widths of ground traces 100a through 100d are varied along their respective routes to maintain uniform spacing D between differential signal conductor pairs 60a-60c and ground traces 100a-100d as differential signal conductor pairs 60a and 60c diverge from differential signal conductor pair 60b to accommodate pitch differences between, for example, integrated circuit bump pitches and printed circuit board ball pitches. Such variation in ground trace width also helps maintain constant impedance in differential signal conductor pairs 60a-60c. As further shown in FIG. 8, the spacing between outer differential signal conductor pairs 60(a) and 60(c) and inner differential signal conductor pair 60(b) gradually increases from $d_1$ to $d_2$ as differential signal conductor pairs 60a and 60c diverge from differential signal conductor pair 60b.

In yet other methods of the present invention, there are provided methods of using the above devices, or of using devices produced according to any one or more of the foregoing steps.

FIGS. 3 through 7 illustrate test parameters and test results obtained using computer simulation techniques applied to the device illustrated in FIG. 1 hereof.

Figure 3:
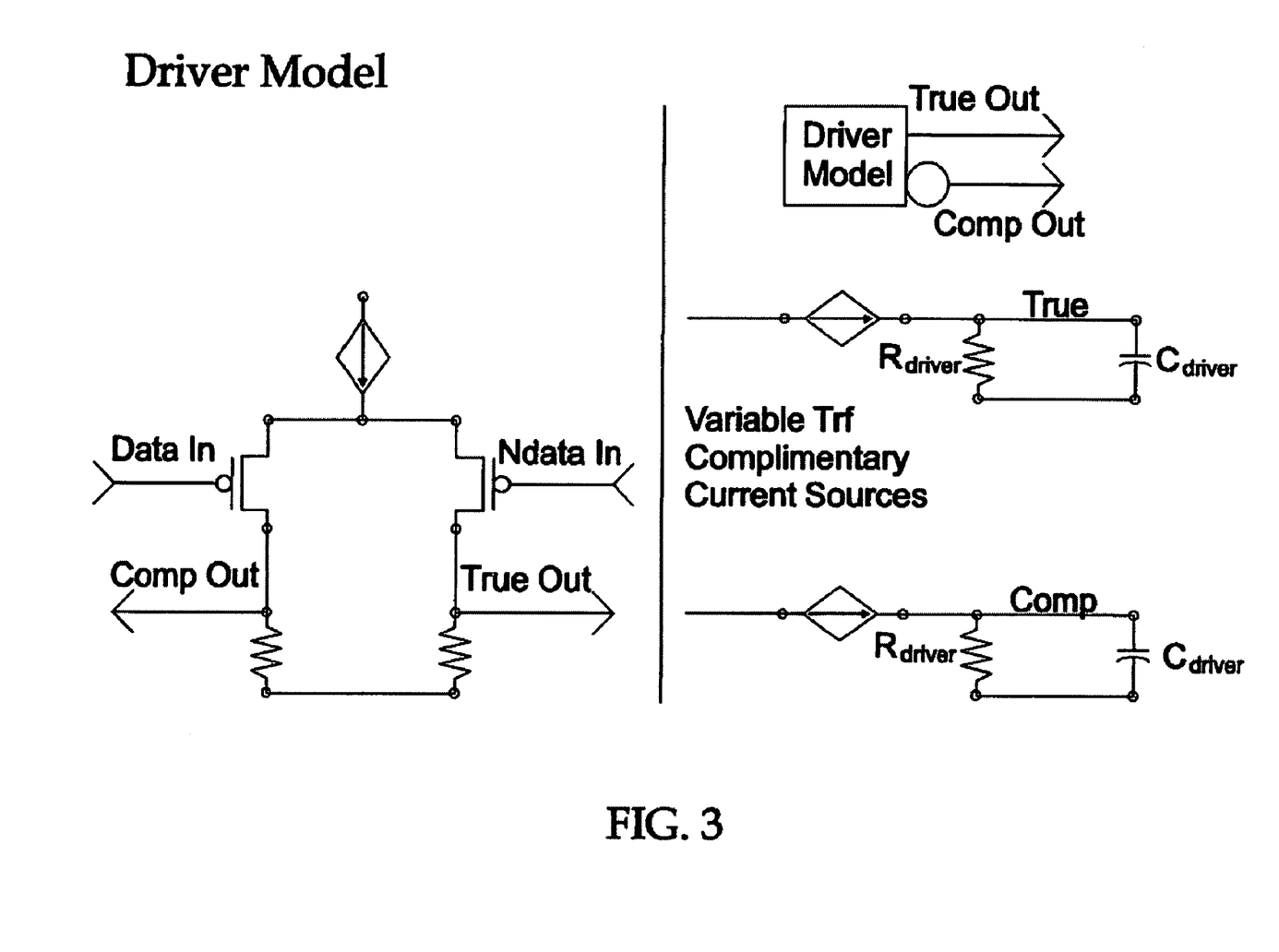
FIG. 3 shows a driver model employed in simulating the cross-talk response of the package shown in FIG. 1.
Figure 4:
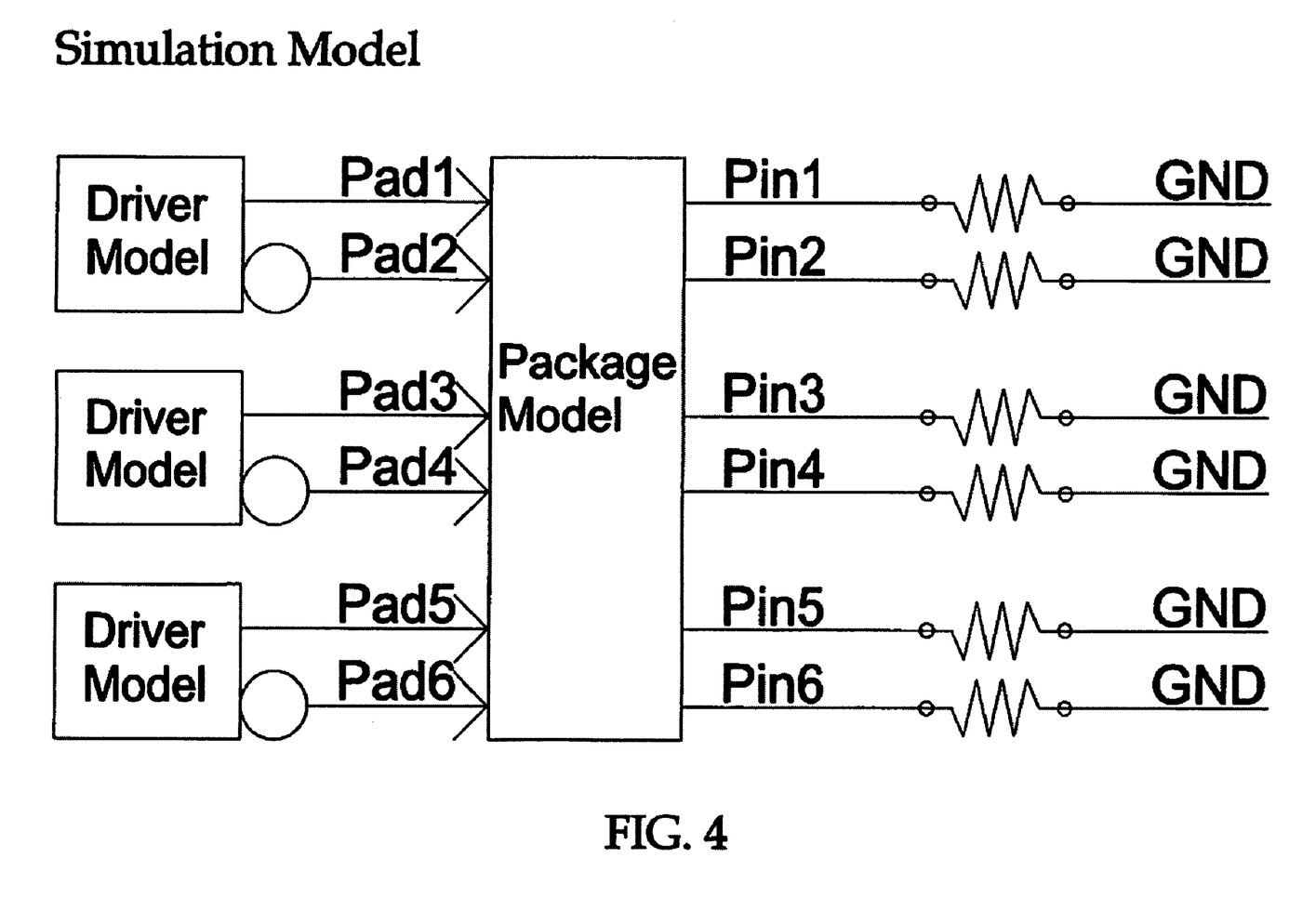
FIG. 4 shows a simulation model employed in simulating the cross-talk response of the package shown in FIG. 1.

FIGS. 3 and 4 show driver and simulation models those skilled in the art will understand were developed to imitate a current steering transmitter communication protocol application. As shown in FIG. 3, the driver model is capable of varying output rise and fall time by means of variable $T_{rf}$ complimentary current sources, as well as by varying output resistance and capacitance ($R_{driver}$ and $C_{driver}$, respectively). The left-hand side of FIG. 3 illustrates the overall circuit employed in the driver model (with Data in, Comp out, Ndata in, True out, and current source 20 mA/Avdd), while the right-hand side illustrates the current sources for True and Comp shown on the left-hand side of FIG. 3 that were employed in the driver model. As further shown in FIG. 4, and as those skilled in the art will understand, three separate drivers were used to stimulate a package model from the pad (or silicon) side, Pad1, Pad2, Pad3, Pad4, Pad5 and Pad6. The pin side (for a printed circuit board) was property terminated for this style Tx. The center pair of differential signal conductors (60b, or pads Pad3 and Pad4) was left static to act as victim conductors, while the outer pairs of differential signal conductors (60a and 60c, or pads Pad1, Pad2 and Pad5, Pad6, respectively) served as aggressor conductors to drive a toggle (1 0 1 0 . . .) signal pattern. Crosstalk was measured differentially at Pin3 and Pin4.

Figure 5:
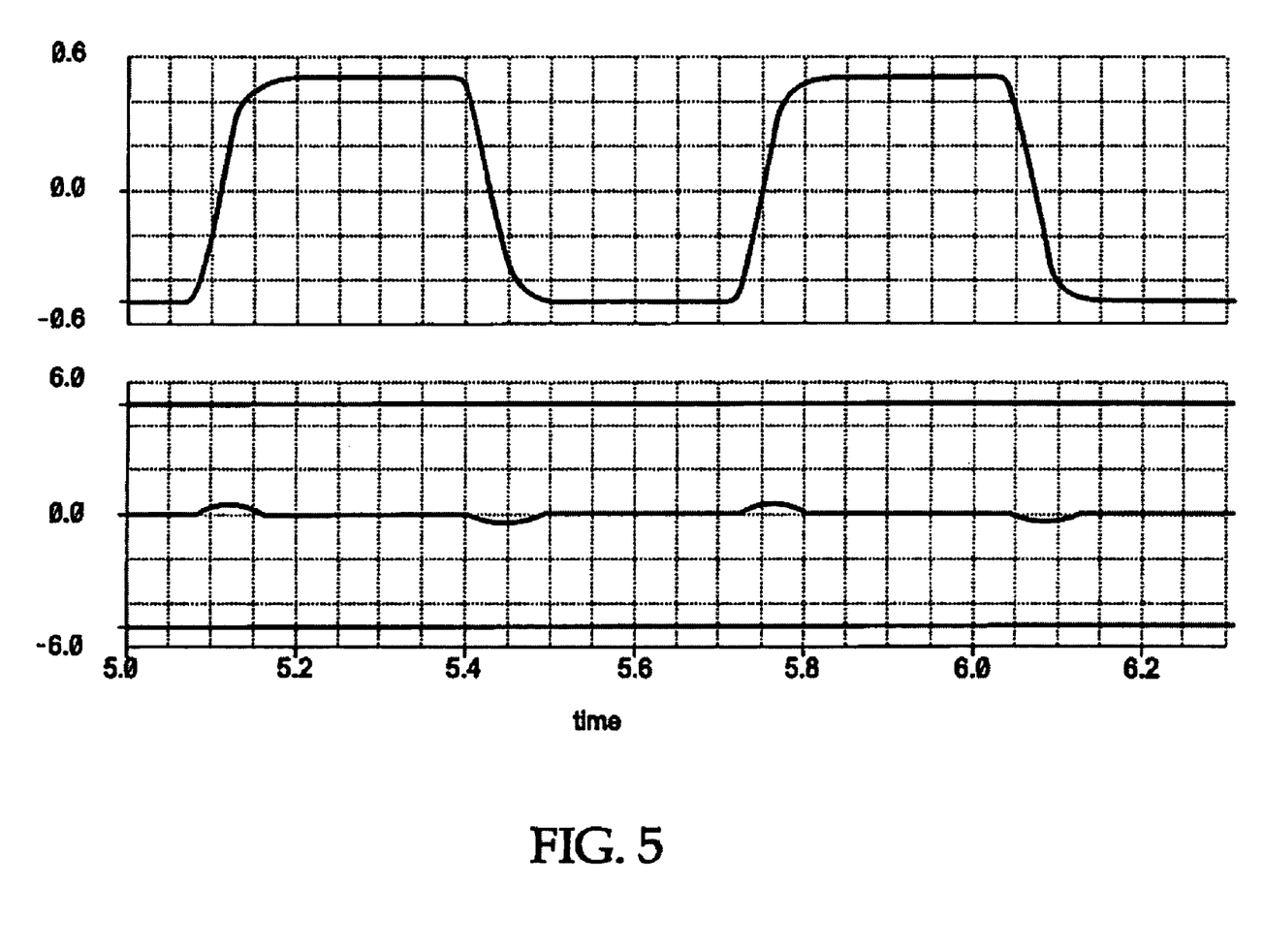
FIG. 5 shows cross-talk simulation results obtained for the package of FIG. 1.

Test results obtained using SPICE, HFSS and RAPHAEL simulators for the embodiment of the present invention illustrated in FIG. 1 exhibited essentially no measurable electric field beyond individual differential signal pairs 60a 60c. Crosstalk between differential signal conductor pairs 60a 60c was less than −60 db for frequencies up to 20 GHz. As shown in FIG. 5, the magnitude of crosstalk occurring between differential signal pairs 60a and 60c and victim signal pair 60b was only 0.46 mV (bottom graph of FIG. 5) for input signals having voltages ranging between about −0.5 volts and +0.5 volts (upper paragraph of FIG. 5).

FIG. 5 further shows that crosstalk of 0.46 mV on center (victim) differential signal conductor pair 60b results from providing 500 mV stimulus inputs on two outer (aggressor) differential signal conductor pairs 60a and 60c. This level represents approximately 0.092% (or 60.7 dB) of crosstalk.

Figure 6:
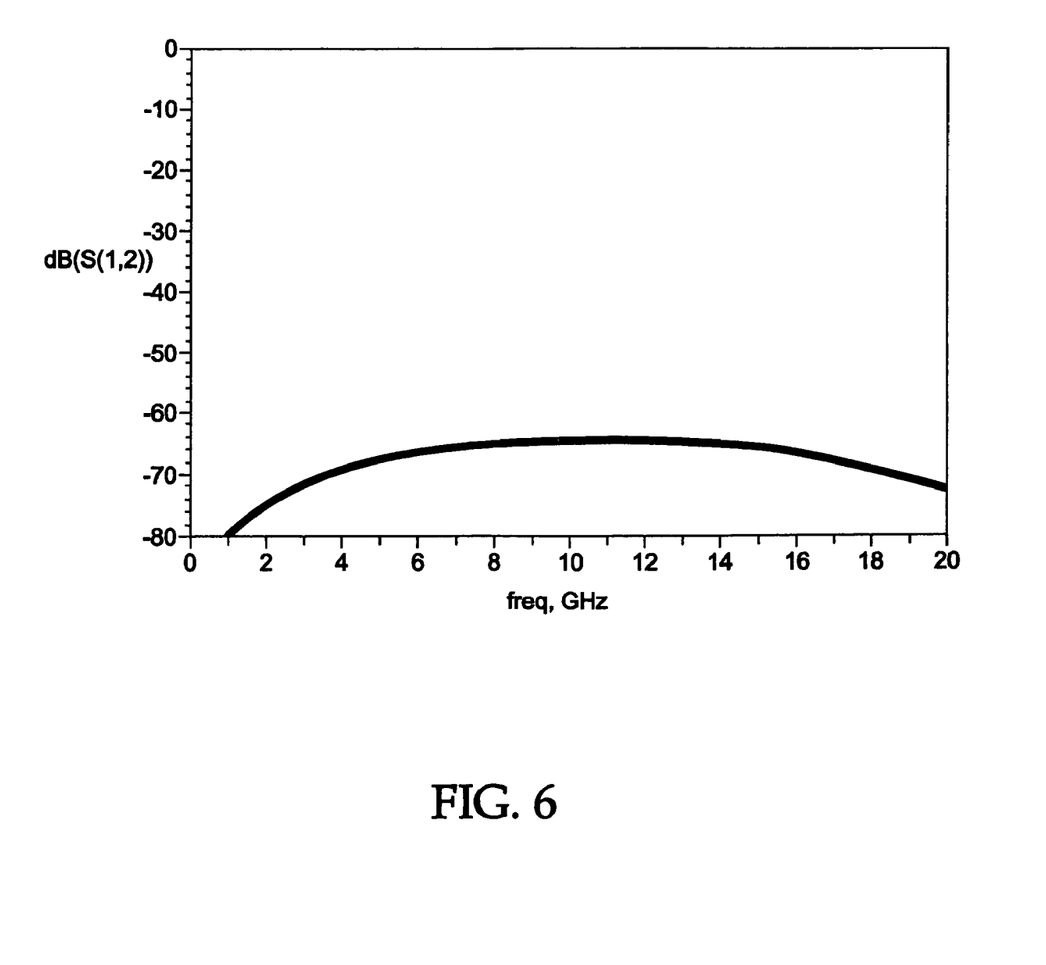
FIG. 6 illustrates test simulation results obtained using a SPICE program for the package of FIG. 1.

FIG. 6 illustrates test simulation results obtained using AGILENT TECHNOLOGIES ADVANCED DESIGN SYSTEM (ADS) software for the embodiment of the invention illustrated in FIG. 1. As shown in FIG. 6, calculated crosstalk between agressor conductor pairs 60a and 60b was less than −65 dB at all measured frequencies.

Figure 7:
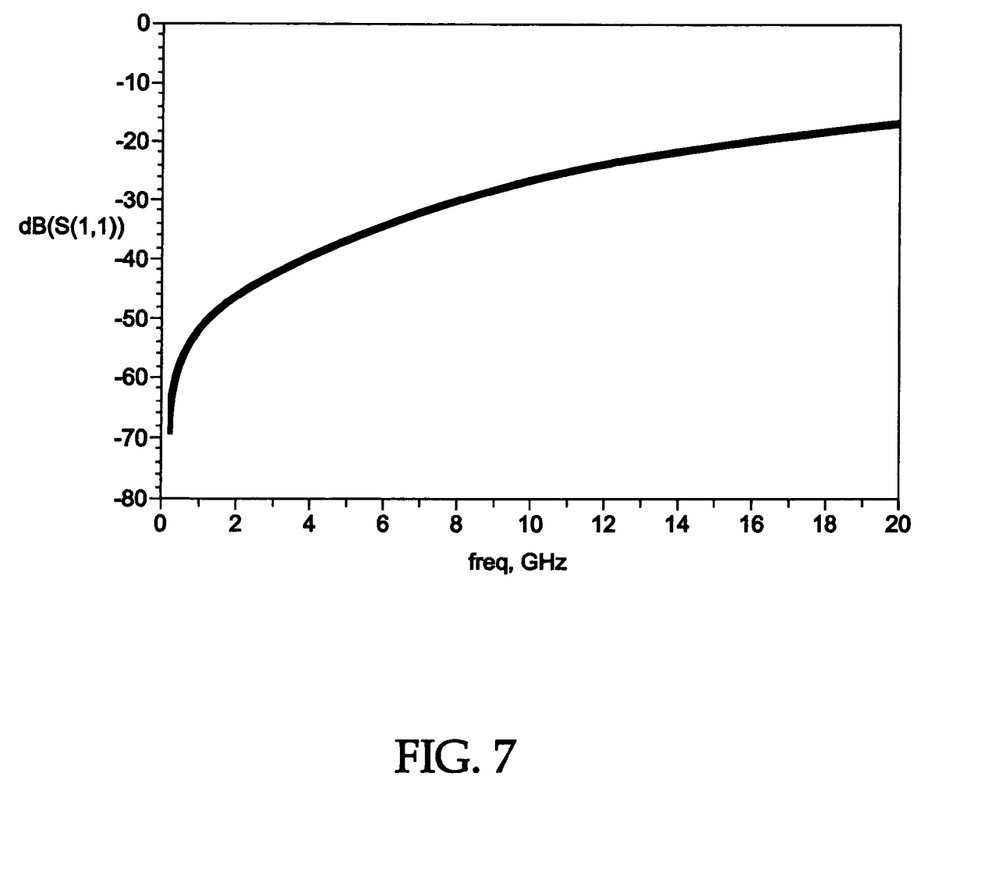
FIG. 7 illustrates test simulation return loss results obtained for one differential signal conductor pair in FIG. 1.

FIG. 7 illustrates test simulation return loss results obtained for one differential signal conductor pair using ANSOFT HFSS and AGILENT ADS modeling programs. Return loss provides a measure of the frequency dependence of impedance, and is important in determining signal integrity in high-data-rate systems. The constant differential impedence obtained using ground traces 100a-100d according to one embodiment of the present invention results in a very low and uniform return loss as shown by referring to FIG. 6. Note that differential impedance remains constant as long as the spacing between ground traces 100a-100d and differential signal conductor pairs 60a-60c remains constant.

It should be emphasized that the above-described embodiments are merely examples of possible implementations. Many variations and modifications may be made to the above-described embodiments without departing from the principles of the present disclosure. All such modifications and variations are intended to be included herein within the scope of this disclosure and protected by the following claims.

Having read and understood the present disclosure, those skilled in the art will now understand that many combinations, adaptations, variations and permutations of known semiconductor die designs, systems, devices, components and methods may be employed successfully in the present invention.

In the claims, means plus function clauses are intended to cover the structures described herein as performing the recited function and their equivalents. Means plus function clauses in the claims are not intended to be limited to structural equivalents only, but are also intended to include structures which function equivalently in the environment of the claimed combination.

All printed publications and patents referenced hereinabove are hereby incorporated by referenced herein, each in its respective entirety.

We claim:

1. An integrated circuit package configured to reduce cross-talk and maintain constant impedance in first and second differential signal conductor pairs incorporated therein, comprising:
    (a) a substrate;
    (b) a first ground plane disposed below the substrate;
    (c) a second ground plane disposed above the substrate;
    (d) respective pairs of first and second differential signal conductors disposed within the substrate and substantially in a first plane; and
    (e) a third pair of victim conductors disposed within the substrate and substantially in the first plane, the third pair of victim conductors further being disposed between the first and second pairs of differential signal conductors;
    (f) at least first and second ground traces disposed in the substrate and substantially in the first plane, the first and second ground traces being disposed, respectively, between the first pair of differential signal conductors and the third pair of victim conductors, and between the second pair of differential signal conductors and the third pair of victim conductors, wherein the first and second ground traces are electrically connected to the first and second ground planes, and further wherein the widths of the first and second ground traces are varied along their respective routes within the substrate to maintain constant impedance in the first and second pairs of differential signal conductors.

2. The device of claim 1, wherein a spacing between the first and second pairs of differential signal conductors is constant.

3. The device of claim 1 wherein a spacing between the first and second pairs of differential signal conductors changes.

4. The device of claim 3, wherein the spacing changes to accommodate pitch differences.

5. The device of claim 4 wherein the pitch differences are associated with changes occurring between the integrated circuit package and a printed circuit board.

6. The device of claim 1, wherein at least one of the first pair of conductors and the second pair of conductors has a trace heights ranging between about 2 μm and about 100 μm, between about 4 μm and about 80 μm, between about 6 μm and about 40 μm, between about 8 μm and about 20 μm, and between about 10 μm and about 14 μm.

7. The device of claim 1, wherein the spacing between the first ground trace or the second ground trace and the first pair of conductors or the second pair of conductors ranges between about 10 μm and about 1000 μm, between about 20 μm and about 500 μm, between about 30 μm and about 250 μm, between about 40 μm and about 120 μm, or between about 60 μm and about 100 μm.

8. The device of claim 1, wherein the spacing between the first ground plane and the second ground plane ranges between about 20 μm and about 1000 μm, between about 40 μm and about 500 μm, between about 60 μm and about 400 μm, between about 80 μm and about 200 μm, or between about 100 μm and about 160 μm.

9. The device of claim 1, wherein at least one of the first pair of conductors and the second pair of conductors has a trace widths ranging between about 5 μm and about 200 μm, between about 20 µm and about 100 µm, between about 40 µm and about 80 µm, between about 50 µm and about 70 µm, and between about 55 µm and about 65 µm.

10. The device of claim 1, wherein the spacing between the first ground plane and the second ground plane ranges between about 20 µm and about 1000 µm, between about 40 µm and about 500 µm, between about 60 µm and about 400 µm, between about 80 µm and about 200 µm, or between about 100 µm and about 160 µm.

11. The device of claim 1, wherein the substrate comprises at least one of ceramic, HiTCE ceramic, high-temperature ceramic, high-temperature ETC ceramic, resin, glass, an electrically insulative material, and a dielectric material.

12. The device of claim 1, wherein the integrated circuit package is a HiTCE package.

13. The device of claim 1, wherein the integrated circuit package is configured for use in high-speed communications equipment.

14. The device of claim 1, wherein the first and second pairs of differential signal conductors are formed from at least one of copper, a metal, a metal alloy, aluminum, gold, and silver.

15. The device of claim 1, wherein a spacing between the first and second pairs of conductors increases along at least portions of the first plane.

16. The device of claim 1, wherein the first or second ground trace has a width that increases as the spacing between the first and second pairs of conductors increases.

17. The device of claim 1, wherein the first ground plane is electrically connected to the first ground trace or the second ground plane is electrically connected to the second ground trace along about every 0.35 mm of ground trace length, about every 0.5 mm of ground trace length, about every 0.84 mm of ground trace length, about every 1 mm of ground trace length, about every 3 mm of trace length, about every 4 mm of ground trace length, about every 5 mm of ground trace length, about every 6 mm of trace length, about every 8 mm of ground trace length, or about every 10 mm of trace length.

18. The device of claim 1, wherein the impedance of the first and second differential signal conductor pairs ranges between about 50 ohms and about 150 ohms, or about 75 ohms and about 125 ohms.

19. A method of making an integrated circuit package configured to reduce cross-talk and maintain constant impedance in first and second differential signal conductor pairs incorporated therein, comprising providing a substrate, providing first and second ground planes disposed above and below the substrate, respectively, providing respective first and second pairs of first and second differential signal conductors disposed within the substrate and substantially in a first plane, providing a third pair of victim conductors disposed within the substrate and substantially in the first plane, the third pair of victim conductors further being disposed between the first and second differential signal conductor pairs; and providing first and second ground traces disposed, respectively, between the first pair of differential signal conductors and the third pair of victim conductors, and between the second pair of differential signal conductors and the third pair of victim conductors, wherein the first and second ground traces are electrically connected to the first and second ground planes, and further wherein the widths of the first and second ground traces are varied along their respective routes within the substrate to maintain constant impedance in the first and second pairs of differential signal conductors.

20. The method of claim 19, further comprising maintaining a constant spacing between the first and second pairs of differential signal conductors.

21. The method of claim 19, further comprising changing a spacing between the first and second pairs of differential signal conductors.

22. The method of claim 21, wherein the spacing changes are configured to accommodate pitch differences.

23. The method of claim 22, wherein the pitch differences are associated with changes occurring between the integrated circuit package and a printed circuit board.

24. The method of claim 19, wherein the substrate comprises at least one of ceramic, high-temperature ceramic, high-temperature ETC ceramic, resin, glass, an electrically insulative material, and a dielectric material.

25. The method of claim 19, wherein the integrated circuit package is a HiTCE package.

26. The method of claim 19, wherein the integrated circuit package is configured for use in high-speed communications equipment.

27. The method of claim 19, wherein a spacing between the first and second pairs of conductors increases along at least portions of the first plane.

28. The method of claim 27, wherein the first or second ground trace has a width that increases as the spacing between the first and second pairs of conductors increases.

* * * * *